United States Patent [19]

Lemelson

[11] Patent Number: 5,571,083
[45] Date of Patent: Nov. 5, 1996

[54] METHOD AND SYSTEM FOR CELL TRANSPLANTATION

[76] Inventor: Jerome H. Lemelson, Suite 286, Unit 802, 930 Tahoe Blvd., Incline Village, Nev. 89451-9436

[21] Appl. No.: 465,953

[22] Filed: Jun. 6, 1995

[51] Int. Cl.$^6$ .................................................. A61M 1/00
[52] U.S. Cl. ............................................................ 604/51
[58] Field of Search .......................... 604/49, 50, 51–53, 604/65–67, 207–209, 246, 264, 280; 128/DIG. 12, DIG. 13

[56] References Cited

U.S. PATENT DOCUMENTS 5,474,687 12/1995 Van Vlasselaer ........................ 604/49

*Primary Examiner*—Manuel Mendez
*Attorney, Agent, or Firm*—J. Kevin Parker

[57] ABSTRACT

A system and method are disclosed for internally delivering cellular transplants to a patient under the automatic control of a computer. A diagnostic imaging modality, such as a CAT or MRI scanning system, generates one or more images of the patient's anatomy showing an anatomical region into which it is desired to deliver the cellular transplants. For each such image, location coordinates with respect to a patient support means are calculated by the computer for each individual pixel making up the image. Location coordinates arc then defined for a select body region corresponding to pixels of the anatomical image(s) designated by a user of the system to receive the cellular transplants. The computer then operates a manipulator arm in order to position a tranplantation tool such as an injection needle or catheter mounted on the arm adjacent to the select body region. In the case of an injection needle, the needle is inserted into the region at the appropriate depth, and an injector is operated under computer control to force a predetermined amount of a transplant medium containing the cellular transplants out of a lumen within the injection needle and into the select body region.

20 Claims, 2 Drawing Sheets

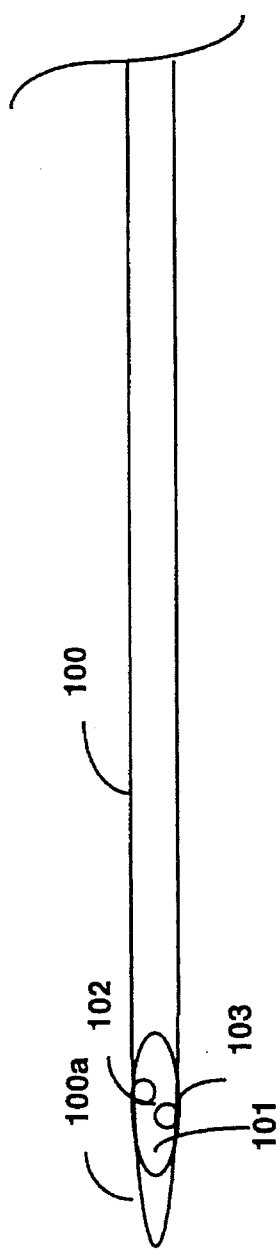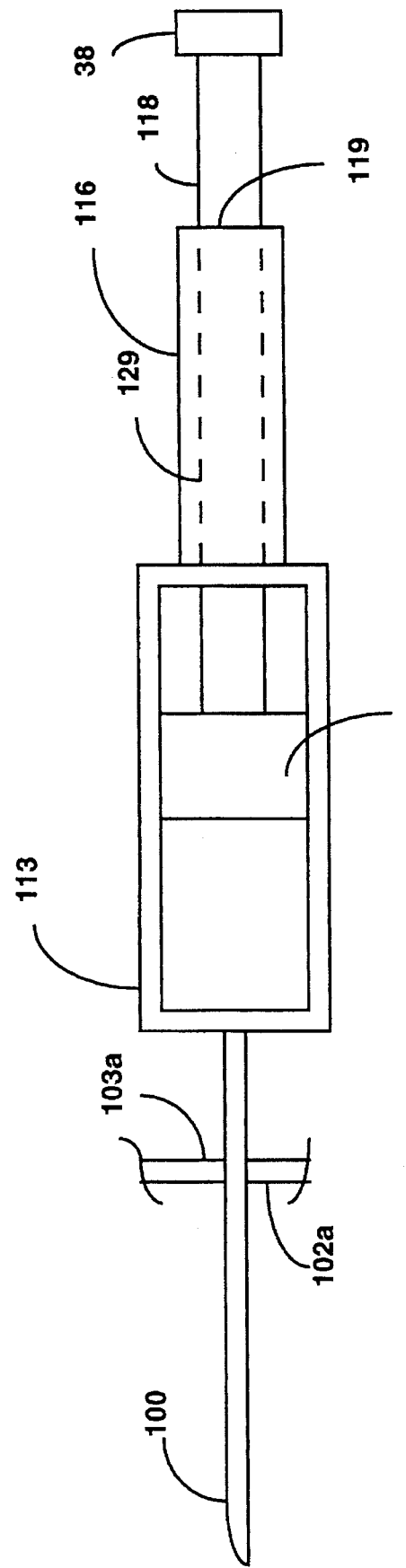

METHOD AND SYSTEM FOR CELL TRANSPLANTATION

BACKGROUND AND SUMMARY OF THE INVENTION

One way to treat disease states due to malfunctioning organs is to effect the surgical transplantation of whole organs. Improvements in operative techniques and in methods for preventing organ transplant rejection have made commonplace the successful transplantation of organs such as the heart, kidney, and liver. Nevertheless, such procedures are still associated with a high degree of morbidity and mortality, besides being very expensive and requiring extensive perioperative care. The most significant factor restricting the applicability of whole organ transplantion operations, however, is the limited availability of donor organs.

Certain disease states involving organ failure can be successfully treated by replacing only a small proportion of the organ mass with populations of donor cells. Such donor cells (referred to herein as "cellular transplants") are obtained from a donor organ by mechanical disruption or enzymatic digestion of the parenchyma of a donor organ. Advances in cell culture techniques have made it possible to maintain donor cells such as hepatocytes in a viable and functional state in vitro for extended periods of time until they are transplanted into a recipient. Successful transfer of such cellular transplants into animal recipients has recently been demonstrated for both liver cells (See Rhim et al., *Science* 263, 1149 (1994)) and heart muscle cells (See Soonpaa et al., *Science* 264, 98 (1994)).

In order fully realize the advantages of cellular transplantation, the transplant procedure should be performed in a minimally invasive manner without the requirement of a surgical operation. Placement of the cellular transplants into the correct anatomic location, however, is critical if the cellular transplants are to function properly after implantation. The present invention is a system and method for accomplishing both of those objectives.

In accordance with the present invention, a transplantation tool (which may be, for example, an injection device such as a hypodermic injection needle or a catheter for delivering cellular transplants through an outflow port to an intraductal or other internal body site within which the catheter is disposed) is manipulated by a manipulator or catheter under computer control so as to deliver a predetermined amount of a fluid transplant medium containing cellular transplants to a select anatomical area of a patient's body as defined by location coordinates locating the select body area with respect to a structure supporting the patient. In one embodiment of the invention, the tranplantation tool is mechanically positioned by a robotic arm operating automatically in accordance with imaging information derived from a scanning system and fed to a computer. In other embodiments, the transplantation tool is positioned manually by an operator while a computer monitors the operation to provide a computer generated indication of when the tool is operatively positioned so as to effect the injection or other delivery of the transplant medium at a selected coordinate location of the body into select body or organ tissue thereof.

It is therefore a primary object of the present invention to provide a system and method for precisely delivering cellular transplants or other agents to a patient at selected anatomical locations.

It is a further object to provide a computerized method and system that enables user designation of selected anatomical locations for cellular transplant delivery via images generated by imaging devices which are stored in a computer and displayed to the user.

It is a further object to provide a system and method that automatically delivers cellular transplants to user selected locations under computer control.

Other objects, features, and advantages of the invention will become evident in light of the following detailed description considered in conjunction with the referenced drawings of a preferred exemplary embodiment according to the present invention.

BRIEF DESCRIPTION OF THE DRAWINGS

FIG. 2 shows the tip an injection needle having lumens for delivery of the cellular transplants into the injection site as well as additional medical agents.

FIG. 3 shows an injection assembly for use in delivering precise amounts of a tranplant medium or other agent through an injection needle.

DETAILED DESCRIPTION OF THE INVENTION

A. General

Figure 1:
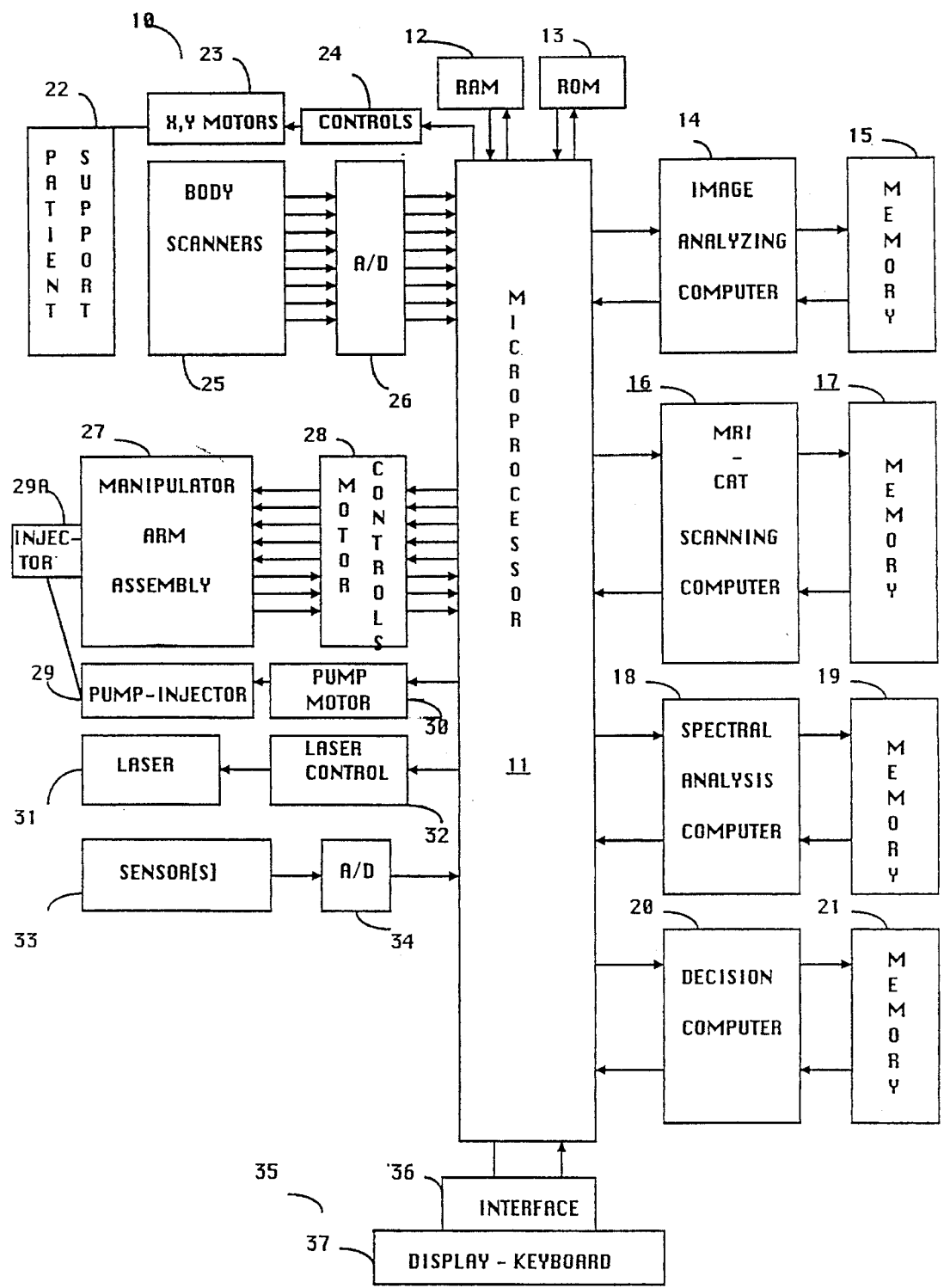
FIG. 1 is a schematic diagram of an exemplary system for delivering cellular transplants and other therapeutic agents in accordance with the present invention.

The location coordinates of select tissue of a living being into which a transplant medium containing cellular transplants is to be injected are defined or computed with respect to images of the patient's anatomy showing anatomical structures which may be generated, for example, by employing computerized axial tomography (CAT scanning), magnetic resonance imaging (MRI), ultrasonography, PET, infrared or microwave imaging, or other types of electronic scanning. In accordance with the present invention, a computer image of a select anatomical area is generated by using one or more of the conventional imaging modalities mentioned above, and a location coordinate with respect to a patient support structure is assigned to each pixel making up the image. The antatomical region into which it is desired to deliver cellular transplants such as tissue or cells is then located on the electronically generated image or images by a radiologist, for example, with selected of the pixels making up the image of the region serving to define the transplant location. A preferred means by which this can be performed is to display the images on a display monitor having a manually positionable cursor for outlining an area containing the lesion. The operator of the system then inputs to a computer digital data in the form of codes defining the anatomical location to which a cellular transplant or transplants are to be delivered as represented by the select pixels within the outlined area. As described below, each pixel of the body or organ image displayed by the computer has assigned to it a set of location coordinates calculated or defined with respect to a structure such as a table supporting the patient while the imaging is performed. The same or a similar patient support structure is then utilized during the cellular transplant operation or injection procedure, the injector or injection needle is carried in movement by the manipulator or catheter under computer control, inserted into select tissue, and operated so as to deliver the cells to select location coordinates with respect to the support structure.

In one form the patient is required to be in the same position with respect to the support structure during both the imaging and tranplantation procedures so that the location coordinates selected will correspond to the proper anatomical region of the patient. One way of accomplishing this is to use a patient support structure having a moldable support structure defining a surface that can be made to conform to the shape of the patient's body as a kind of body cast. Once such a body impression is made, the patient may be placed in substantially the same position on the support structure for both scanning/imaging and subsequent transplantation procedures. Such a moldable patient support may also serve to immobilize the patient during both procedures. Other patient retraint devices, such as straps and adjustably positionable table stops, may also be employed.

The manner of assigning location coordinates to each image pixel depends upon the particular imaging modality. For example, with a conventional CAT scanner, the x-ray tube emits a narrow beam of x-rays toward the patient with an x-ray detector, such as an array of scintillation detectors, positioned on the opposite side of the patient on which an x-ray shadow is formed. The x-ray tube and detectors, mounted on a rigid gantry, are rotated in multiple steps about the body until an entire axial slice is viewed from multiple angles. Codes defining the data acquired by the scintillation detectors are entered into a computer which uses mathematical algorithms to recontstruct a cross-sectional image of the region examined. Such a computerized scanning arrangement calculates the degree to which the tissue interposed between the x-ray tube and the detectors absorb the x-ray beam and thereby provides an attenuation coefficient for each area of tissue examined. Essentially, the quantity of x-ray absorbed in small volumes(voxels) of body tissue in the slice is computed. Computer analysis of the data collected then allows assignment of a numerical value to each small area (pixel) of the cross-sectional plane. By means of a digital-to-analog converter, the numerical value of each pixel is translated to a gray scale for driving a CRT display or the like.

Due to the nature of the CAT scanning image reconstruction algorithm, the computer necessarily must assign location coordinates to each pixel with respect to the x-ray detector in order to generate the displayed image. Such coordinates are computed with respect to the patient support structure in the axial plane which is being imaged. In order for such coordinates to be useable for properly directing a transplantation tool in accordance with the present invention, however, they must be scaled and combined with another cooordinate along the axial axis. In order to assign an axial location coordinate with respect to the patient support structure for each pixel, the positions of the x-ray tube and detector with repect to the patient support surface are sensed, and digital signals are generated that are input to the computer during the imaging procedure. The location coordinates for each pixel making up the image with respect to the patient support structure may be then readily calculated.

In pulse-echo ultrasound techniques, an ultrasonic pulse is transmitted through the body tissues with the reflected echoes from each acoustical interface sensed by a transducer in order to provide a train of digital signals that define an image of the underlying structure. In so-called B-mode ultrasound, the pulse-echo procedure is performed in scanning manner to provide signals for imaging the underlying morphologic structures in a tomographic format. The resulting scanning signals, after digitization, are used by electronic circuitry to construct a two-dimensional array of pixel values for driving a display. In order to construct an image, each pixel is assigned a coordinate location with respect to the transducer in the same plane at which the ultrasound is emitted. Conventional ultrasonic scanning, however, requires that the ultrasonic transducer be contacted or coupled to the body surface over the region to be examined and positioned so as to scan at various angles. In order for the computer to compute the location coordinates for each pixel making up a display of an ultrasonic scan, the transducer is mounted on a movable arm having sensors in its joints for producing signals proportional to the degree of flexion or rotation of each such joint, which sensors generate signals that are then fed to the computer for calculating the arm's position and orientation. Using appropriate scaling factors, the location coordinates for each pixel making up the image with respect to the patient support means may be readily calculated by a computer supplied with the above-mentioned data.

Computerized image construction in conventional MRI scanners, for employment in the present invention, is similar to that used in CAT scanners in that intensity values for an array of pixel values are computed with each pixel value stored in the computer being assigned a set of location coordinates in order to generate the image. In MRI scanning, nuclei such as protons are subjected to a magnetic field gradient, called the slice-select gradient, which varies along the axis perpendicular to the plane of the image. Certain protons (such as hydrogen nuclei of water molecules in the tissue being scanned) within the magnetic field gradient are excited to resonance by a so-called 90 degree RF pulse which causes them to emit detectable radiation. The amplitude and frequency of such emitted radiation is used to assign proton density values to pixels and generate the MRI image. The location coordinates of each pixel in the image are calculated with respect to the patient support structure within the plane of the image cross-section, assuming the receiver coil of the MRI scanner remains at a fixed distance from the patient support structure. In order to derive an axial coordinate value (ie., along an axis perpendicular to the plane of the cross-sectional image) for each pixel, it is necessary for the computer to compute the distance along the slice-select gradient with respect to the patient support structure where the Larmor frequency of the excited nuclei corresponds to the frequency of the 90 degree RF pulse. Such a computation only requires that the computer be supplied with data reflecting the magnitude of the slice-select gradient field versus distance and the frequency of the RF pulse which can either be assumed to be in accordance with computer command or can be sensed by magnetometers and a separate RF receiver coil. MRI scanners also allow the particular gradient fields to be generated along arbitrarily chosen axes so as to produce images not only in the transverse plane but also in coronal, sagittal, and oblique planes. The axial coordinate for each image is then computed in the same way as just described, but the coordinate is then along an axis perpendicular to the plane of the cross-sectional image. Finally, since the patient support structure and the MRI imaging apparatus are relatively moveable with respect to one another, the computer is fed with data produced by position sensing means so that the location coordinates can be translated so as to be with respect to the patient support structure.

Once the location coordinates defining the select body region into which it is desired to inject the cellular transplants have been calculated by the computer, a manipulator arm on which is mounted a tranplantation tool is moved to the select body region under computer control. In the case of an injector-type tranplantation tool, the injection needle is then inserted into the select body region at an insertion site on the surface of the body, and a predetermined amount of a transplant medium is injected into the region. The process may then be repeated at different needle insertion depths for the same insertion site or at different insertion sites in the select body region. As will be described more fully below, electro-optical sensing and monitoring means may be provided allowing the effects of the injection to be monitored by the computer so that the results of such monitoring may be used to control further injections.

B. System Description

FIG. 1 shows a system 10 for effecting the automated performance of a cellular transplant procedure in accordance with the present invention. The cellular transplants may be delivered internally to a patient by injection where a hollow tube or needle, such as a hypodermic needle, is automatically positioned with respect to the patient by means of a multiple axis electro-mechanical manipulator which is controlled in its operation by coded control signals generated as a result of scanning that portion of the patient's body where it is desired for the transplant cells to be implanted. A catheter for delivering cellular transplants mounted to a manipulator may be similarly directed under computer-control to an intraductal or other internal body site.

The scanning signals may be generated by one or more known scanning devices such as a nuclear magnetic resonance (NMR or MRI) scanning system, a computerized axial tomography (CAT) scanning system employing X-ray scanning, a positron emission tomographic (PET) scanning system, various infrared scanning systems operable to generate image signals of tissue and bones, or ultrasonic pulse-echo scanning systems. Such scanning signals may be computer processed and analyzed to generate multiple cross-sectional views of the portion of the body where it is desired to deliver the transplant cells. The image information defined in the cross-sectional views or slices of the body tissue may be digitized to generate trains of digital (picture) signals which are analyzed by a computer wherein resulting code signals are generated defining the borders of the anatomical structures and which may be further computer processed to provide further code signals indicative of coordinate locations of those structures. Such coded information may be used by the computer to control the operation of an automatic multi-axis manipulator for a surgical or treatment device, such as a hypodermic needle and a motorized pump, to automatically position and cause the needle to directly penetrate the skin and to pass through tissue aligned with and including the tissue where it is desired to implant cells. After and/or during such penetration of tissue, the computer controls the operation of a pump motor and/or valve actuator solenoid to cause a select amount of a transplant medium containing the cellular transplants to enter the tissue and implant therein.

The medical procedure described above may be applied once or repeated a number of times without surgery or may supplement surgery which may also be computer controlled by one or more surgical devices such as powered cutting tools, blades positioned and moved in cutting operations by the computer controlled manipulator, nozzles generating high velocity jets of liquid medication(s), one or more lasers generating a beam or beams of tissue penetrating surgical radiation or other surgical device(s) supported and operatively moved by the manipulator.

System 10 includes a number of computers, devices and subsystems which are automatically controlled in their operation or generate feedback information in the form of signals passed through a control computer or microprocessor 11. An image analyzing computer 14 with an attendant programmable memory 15 analyzes image information generated by an NMR or CAT scanning computer 16 with attendant memory 17 which receives digitized image information from a plurality of MRI sensors 25 which scan a select portion of the body of a patient held immovable against a patient support or table 22 which is motorized and driven in multi-axis movement by a plurality of gear motors 23, the controls 24 of which are operated by trains of digital control signals passed through microprocessor 11 from either manual controls and/or one of the computers connected to the microprocessor. While conventional CAT and MRI scanning arrangements generally rotate and axially move the patient through the scanning field, the MRI, CAT, PET body scanners or array of sensors 25 may also be supported on a mount which is motor driven and controlled to move about or along one or more axes by means of a computer such as a decision computer connected to the microprocessor and operable to analyze the signals output by one or more of the computers 14 and 16 to effect control of the treatment operation and/or at least a portion of the scanning operation. The analog image signals output by the body scanners are converted to trains of digital image signals by one or more analog-to-digital converters 26 which pass such trains of signals through microprocessor 11 to the MRI or CAT scanning computer 16 for analysis and conversion to usable image information for use by the image analyzing computer 14.

In the preferred embodiment, a manipulator arm assembly 27 of conventional design is supported adjacent the patient support 22 to which it is preferably connected. The plurality of articulated arms of the multi-axis manipulator are operated by respective reversible gear motors (not shown) which are controlled in their operations by a bank of controls 28 which receive and pass direct command control signals from the computer 20 and apply feedback signals from the manipulator motors to effect a suitable degree of precision operation of the manipulator to selectively position its operating head and surgical device such as a laparscope and/or injection needle in alignment with select tissue to be treated or operated on.

In FIG. 1, the manipulator 27 has an operating head 29A containing an elongated tube or hypodermic-type needle supported thereby and operable to be driven by the controlled operation of one or more of the motors driving the manipulator 27 or a separate motor supported by the operating head to force the injection needle through body tissue located by the scanning system. A pump motor 30 drives a pump 29 when its control input is operated by a start-signal received from computer 20 after the manipulator 27 has been controlled to position the injections needle in alignment with the implant location and the needle has penetrated the tissue.

A sensor or sensor array 33 may be located on the manipulator head or injector assembly 29A and may be operable to receive light reflected from tissue adjacent the end of the injection needle. An optical fiber light pipe may extend from the output of the laser 31 through and to the open end of the injection tube or needle to conduct laser light to tissue adjacent the open end of the needle while a second optical fiber may extend from such open end, back up another light pipe in the needle to the sensor 33. An additional lumen in the needle may be used to permit a liquid drug to pass down along the needle or tube and into select tissue penetrated by the needle. Resulting spectral radiation emitted by the tissue intersected by the laser radiation is passed to the end of the optical fiber adapted to receive same and back along such fiber to the photodetector at the other end thereof which generates an analog electrical signal modulated with spectral information relating to the tissue intersected by the laser light.

Also shown connected to the control computer or microprocessor 11 via an interface 36 is a computer 35 such as a workstation or PC which includes a display and a keyboard which is operable to input data to the RAM 12 or any of the computers 14, 16, and 18 or to control the operation of the manipulator 27, pump motor 38 and laser 31 or a plurality of such subsystems and devices for performing the described treatment or surgical operations. It is noted that the pump 29 may be varied in its operation in accordance with the control signals generated by the decision computer 20 to a controller for such motor to predetermine the quantity and rate of flow of transplant medium or medication pumped to the injector 29A after its injection tube or tubular needle has been driven under computer control to a select location with respect to select tissue. A plurality of pumps, such as pump 29, are operated by respective pump motors may be provided mounted on the operating head of the manipulator, each of which pumps is operable to force flow a different medical material from a respective of a number of reservoirs to the needle or tube of the injector 29A.

System 10 may also be operable to automatically perform auxilliary or other operations on select tissue such as select tissue manipulation, handling, or cutting operations using one or more automatically positioned and controlled grippers or cutting tools which are supported by the operating head of the manipulator 27 and controlled in powered operation to cut select tissue or employing one or more lasers to ablate, burn or otherwise operate on such select tissue. Such surgical operations may be effected per se or in combination with the described selective injection of transplant cells in accordance with location information derived from one or more of the described scanning techniques.

A modified form of system 10 may also employ a computer controlled manipulator operable to (a) insert and drive a catheter into or through a body duct, (b) effect a small opening in a select portion of skin or other body tissue and insert a surgical instrument such as a laparoscope therethrough and power drive same in one or more of a plurality of operations on and with respect to select tissue within the body, which operations may include forcing an injection needle from the tube of the instrument to cause it to penetrate and inject a select amount of transplant cells as described into select tissue. Such operations may also include the application of laser light energy, as described, to inspect and/or operate on select tissue deep in the body and one or more micromanipulators to hold or manipulate select tissue during the surgical operations.

Not shown, but assumed to form part of the computer 35 and its peripheral controllers, are manual means for effecting selective control of the described manipulators and the body tissue scanning devices, for use by medical personnel in supplementing the computer controlled operations in the performance of certain operations to detect and treat select tissue of the body. Computer controlled imaging and laser range finding devices may also be employed to provide scanning signals for computer 14, to permit the computer to further analyze the image content defined by select cross-sectional views or slices generated by the CAT or MRI scanning system 25 so as to automatically determine the depth location and three dimensional shape of the transplant site and to provide coded control signals for effecting automatic surgery on select tissue or treatment as described. Thus the body scanning system 25 may be employed per se to generate computer analyzable image information or may be Supplemented with image information generated by an electronic camera such as a television camera and/or by one or more laser-photodetector scanning arrangements which are fixedly supported adjacent the patient support, supported to move with the manipulator of the scanners of system 25 and/or supported on the head of the automatic manipulator 27 or by a separate manipulator (not shown).

C. Injector Description

FIG. 2 depicts the tip of an injection needle 100 (that may be, for example, of approximately 30 gauge size) in accordance with the present invention. A sharp tip 100a allows the needle to puncture skin and other tissue and to be driven to a select depth into a select body region. Disposed within the needle is a lumen 101 for delivering a drug or other agent to the tissue in which the needle is inserted. Also disposed within the needle are additional lumens 102 and 103. In one embodiment, the lumens 101 and 102 may be used to inject additional medical agents such as collagen into the transplant site. In other embodiments, the lumens 102 and 103 may contain optical waveguides for transmitting light to the tissue for therapeutic or diagnostic purposes. Such waveguide may consist of an optical fiber supported within a passageway or may be a waveguide consructed integral with the needle. In the latter case, a light transmissive core of one refractive index is surrounded along the length of the needle by material of another refractive index so as to constitute a cladding and enable the transmission of electromagnetic radiation. Such radiation may be laser radiation generated by laser 31 used used to perform a surgical procedure, or may be other types of therapeutic radiation. If the light radiated from the waveguide is to be used for diagnostic purposes, a second waveguide disposed within lumen 103 of needle 100 captures the radiation emitted from the first waveguide after it has been scattered or reflected by tissue components such as cells, subcellular organelles, molecules, or other structures. Such light is transmitted by the second waveguide to photodetector 33 and analyzed by spectral analysis computer 18.

FIG. 3 shows an exemplary injector 29 for delivering a controlled amount of a transplant medium or other agent to the select tissue through conduit 101. The injector 29 comprises a syringe 113 for containing a quantity of the medium to be injected and connected to needle 100. A plunger or piston 114 moves through the barrel of the syringe 113 to displace the fluent medium into conduit 101 from where the medium is injected into the selected tissue site. Also shown connected to needle 100 are a conduit 103a for connecting to lumen 103 and a conduit 102a for connecting to lumen 102 of needle 100. The injector 29 is mounted on manipulator arm 27 so as to be movable and positionable under computer control. In order to for the injector to deliver controlled amounts of the transplant medium under the control of microprocessor 11, the linear motion of plunger 114 is effected by a motor 38 which rotates a shaft 118 joined to plunger 114. Shaft 118 is threaded and disposed within an oppositely threaded member 119 attached to the end of syringe 113 such that rotary motion of the shaft 114 causes linear motion of the plunger 114 through the barrel of syringe 113. Signals indicative of the position of the plunger 114 are fed back to the microprocessor 11 by means of a linear differential transformer 116 mounted to syringe 113 and having an axial passage through which shaft 118 moves. A magnetic core 119 is provided within the portion of shaft 118 which moves axially through the transformer 116 such that a voltage signal proportional to the axial position of the core is thereby generated. Since the axial position of the core 119 corresponds to the axial position of the plunger 114 within syringe 113, the motion of the plunger 114 may be precisely controlled by the computer or microprocessor 11 to deliver controlled amounts of the transplant medium to the needle 100.

D. Example Applications

EXAMPLE I

Hepatocyte transplantation may be used to effect replacement of liver function by injecting a quantity of hepatocytes (contained within a transplant medium such as saline) into an appropriate anatomic site where the hepatocytes are allowed to implant within an extracellular matrix and express differentiated hepatocyte functions. Depending upon the quantity of hepatocytes so transplanted, different degrees of liver function deficiencies may be corrected by replacement of liver function with the cellular transplants. Cellular transplantion of hepatocytes is most advantageous, however, in treating liver disease caused by genetic defects resulting in the absence or decreased function of a single enzyme or other protein product. Such diseases include, for example, the hyperlipidemias and alpha-antitrypsin deficiency. In such cases, a small number of transplanted hepatocytes may be enough to correct the disease by replacing the missing or deficient protein. Such small numbers of hepatocytes can be obtained by a minor wedge liver resection of a living donor who has been tissue matched to the patient. In other applications, greater numbers of hepatocytes may be transplanted and may include hepatic cells which are able to proliferate after transplantation.

In order to perform the transplantation procedure, system 10 is first operated to generate code signals defining digitized images of the patient's body using an appropriate imaging modality or modalities. By analyzing such images, the injection site is selected by user designation (such as by outlining the site with a cursor on a video monitor) of pixels defining the site. Computerized analysis of the image data as described above allows the location coordinates of the selected injection site to be computed, which location coordinates are then applied by the computer to position and actuate the injector. Animal experiments have been conducted whereby hepatocytes have been transplanted both into the spleen and directly into the peritoneal cavity. It has been found, however, that while such cellular transplants are functional and able to carry out bilirubin conjugation, they are not able to survive and function for long periods of time. It is supposed that transplanted hepatocytes need to be exposed to hepatotrophic factors contained in the portal blood flowing to the liver in order exhibit sustained viability and functioning. It is therefore desirable to transplant hepatocytes into the liver parenchyma. In one technique for accomplishing this, the injection site is the patient's spleen. After computation of the spleen's location coordinates, the injector is robotically positioned to inject a transplant medium containing hepatocytes into the spleen. The transferred hepatocytes then migrate via the splenic vein into the liver parenchyma (See Gupta et al., *Seminars in Liver Disease* 12, 321 (1992)). In another technique, branches of the portal vein are imaged by, for example, CAT scanning of the abdomen after injection of a radioopaque contrast medium. The location coordinates of the portal branches feeding the separate lobes of the liver may then be used to inject the transplant medium into a portal branch and thus infuse a specific liver lobe with hepatocytes. Such selective infusion allows continued portal blood flow through the other liver lobes and prevents possible complications due to occlusion of the portal blood supply by transplanted cells.

EXAMPLE II

In another application of the present invention, heart muscle cells are injected into the myocardium of a patient's heart by the operation of system 10. The appropriate injection site, such as a select region of the ventricular myocardium, is imaged using one or more of the imaging modalities described above. The location coordinates of the injection site are computed, and the injection needle is robotically inserted into the patient's mediastinum and then into the myocardium using the computed location coordinates. After injection into the heart muscle, the transplanted cells interconnect with existing cardiomyocytes both electrically and mechanically by forming gap junctions and desmosomes, respectively. The transplanted cardiomyocytes are then able to at least partially correct deficiencies in pumping function brought about by previous heart cell death due to injury or disease. In order for the transplanted cells to be better capable of invading the myocardium, cellular transplants that exhibit replicalive capacity may be employed. Such cells may be obtained from fetal donors or genetically engineered to retain the capability of dividing. Heart muscle cells genetically modified so as to express angiogenic growth factors may also be employed. Such growth factors act to induce the formation of additional blood vessels supplying the myocardium and thus alleviate ischemia resulting from occlusive blood vessel disease.

EXAMPLE III

One or more of the automatic medical manipulators described above may also be employed to operate on and repair bone in the body of a living being by cutting and/or ablating select portions thereof with a laser and/or by disposing select quantities of fluent bone material mixed with collagen or other organic matter to replace diseased or injured bone, fill in cavities in bone, etc. The described manipulator supporting the described tube or needle may be employed to apply select fluent bone matter made up of cultured osteoblasts in vivo to replace injured, malformed or diseasaed bone which may be surgically removed as described, wherein the bone mixture ejected from the opening in the needle or tube solidifies or sets in place and eventually becomes part of the bone to which it is applied. Laser light passed through and out the end of the needle or tube as described above, may also be employed to operate on and ablate select bone, such as diseased or injured bone and/or to effect radiation setting or polymerizable material in the mixture or applied to select bone as described to adhere the ejected bone mixture to the bone to which it is applied. An auxilliary manipulator or gripper supported by surgical tool manipulator may be automatically operated as described to handle and hold select tissue during a computer controlled surgical or cell-transplant operation.

Although the invention has been described in conjunction with the foregoing specific embodiments, many alternatives, variations, and modifications will be apparent to those of ordinary skill in the art. Those alternatives, variations, and modifications are intended to fall within the scope of the following appended claims.

What is claimed is:

1. A system for delivering cellular transplant material to a patient comprising:

a computer;

a tranplantation tool for delivering a fluid transplant medium containing cellular transplants into tissue;

an automatic manipulator including a manipulator arm assembly for supporting and operating said tranplantation tool and a power driving device for moving said manipulator arm along multiple axes;

a patient support structure having a support surface;

a power driven device operable under computer control for moving said support surface and said manipulator arm assembly relative to one another to cause the manipulator arm assembly to controllably move said tranplantation tool into select regions of the patient's body;

a scanning system including an imaging device for generating image information of select anatomical regions of the patient's body;

a plurality of sensors for sensing the relative positions of said patient support, said manipulator arm assembly, and said scanning imaging device, and generating and feeding coded signals representing the sensed positions to said computer;

a first computer program for calculating location coordinates of select body regions defined by pixels of images produced by said scanning imaging device and using the coded signals representing the sensed relative positions of said patient support means and said imaging device; and a second computer program for calculating location coordinates of said injection needle and determining when said tranplantation tool is located at said select body region into which it is desired to deliver said cellular transplants.

2. A system in accordance with claim 1 further comprising an electronic display device for displaying images and allowing the designation and inputting to said computer of select pixels of said images that correspond to select regions of the patient's body into which it is desired to dispose said transplantation tool and deliver said cellular transplants.

3. A system in accordance with claim 1 wherein said imaging device includes an ultrasonic pulse-echo transducing means and wherein said actuator for effecting relative movement between said patient support surface and said imaging device includes a manipulator arm assembly for positioning said ultrasonic transducer under control of said computer.

4. A system in accordance with claim 1 wherein said scanning system includes a magnetic resonance imaging device.

5. A system in accordance with claim 1 wherein said scanning system includes a computerized axial tomography scanner.

6. A system in accordance with claim 1 further comprising an actuator for effecting relative movement between said patient support and said imaging device under control of said computer.

7. A system in accordance with claim 1 wherein said transplantation tool is an injector assemby comprising an injection needle having a conduit therein for flowing a fluid transplant medium containing cellular transplants into tissue in which the needle is inserted and an injector for forcing the transplant medium through said conduit.

8. A system in accordance with claim 7 further comprising a program for automatically controlling movement of said manipulator arm assembly so as to cause the insertion of said injection needle into said select body region at a desired depth.

9. A system in accordance with claim 7 further comprising a program for automatically controlling operation of said injector so as to cause it to inject a pretermined amount of said transplant medium into said select body region.

10. A system in accordance with claim 1 wherein said transplantation tool is a catheter having an outflow port for delivering transplant cells to an intraductal or other internal body site into which the catheter is inserted.

11. A method for internally delivering cellular transplant material into a patient, comprising the steps of:

supporting a patient on a patient support which is relatively movable with respect to a tranplantation tool mounted on a computer controlled manipulator arm to permit the tool to be inserted into select regions of the patient's body under control of a computer;

scanning a select portion of the patient's body with a scanning device so as to generate scanning information relating to select regions of the patient's body;

sensing the relative positions of said patient support, said tranplantation tool, and said scanning imaging device, and generating and feeding coded signals representing the sensed positions to a computer in digitized form;

operating the computer to calculate location coordinates of a select body region requiring treatment and defined by select pixels making of the images produced by said scanning imaging device, using the coded signals to predeterminately and relatively position of said patient support means and said scanning device;

designating and inputting to a computer information defining select pixels of images produced by said scanning device which information represents select regions of the patient's body to which it is desired to deliver select cellular transplant material;

calculating location coordinates of said injection device and determining if an operating end of said tranplantation tool is properly located at a select body region into which it is desired to deliver the cellular transplants; and, when so located, operating said tranplantation tool to deliver a select amount of said transplant medium into said select body region.

12. A method in accordance with claim 11 wherein said imaging device and said patient support are relatively movable with respect to each other and said method further comprising the step of selectively positioning said scanning device under computer control so as cause it to generate images of select portions of the patient's body.

13. A method in accordance with claim 11 wherein said transplantation tool is an injector assemby comprising an injection needle having a conduit therein for flowing a fluid transplant medium containing cellular transplants into tissue in which the needle is inserted and an injector for forcing the transplant medium through said conduit.

14. A method in accordance with claim 13 further comprising the steps of automatically moving said injection device under control of said computer until said injection device is inserted into tissue of said select body region into which select tissue it is desired to deliver said cellular transplant material and automatically injecting a select amount of said transplant medium therein.

15. A method in accordance with claim 14 further comprising the step of computer controlling the amount of transplant material injected into said select body region.

16. A method in accordance with claim 13 further comprising the step of injecting a medicinal agent into said select body region through a second conduit extending through said injection needle.

17. A method in accordance with claim 13 wherein said hepatocytes are injected into a branch of the patient's portal vein.

18. A method in accordance with claim 11 wherein said transplantation tool is a catheter having an outflow port for delivering transplant cells to an intraductal or other internal body site into which the catheter is inserted.

19. A method in accordance with claim 11 wherein said cellular transplants comprise hepatocytes.

20. A method in accordance with claim 11 wherein said hepatocytes are injected into the patient's spleen.

* * * * *